US008543888B2

(12) United States Patent
Bommena et al.

(10) Patent No.: US 8,543,888 B2
(45) Date of Patent: Sep. 24, 2013

(54) PROGRAMMABLE CYCLIC REDUNDANCY CHECK CRC UNIT

(75) Inventors: Sudhir Bommena, Bangalore (IN); Igor Wojewoda, Tempe, AZ (US); Yong Yuenyongsgool, Gilbert, AZ (US); Vijay Dubey, Chandler, AZ (US); Roshan Samuel, Chandler, AZ (US); Jonathan Brant Ivey, Maricopa, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 489 days.

(21) Appl. No.: 12/776,476

(22) Filed: May 10, 2010

(65) Prior Publication Data

US 2010/0313104 A1 Dec. 9, 2010

Related U.S. Application Data

(60) Provisional application No. 61/185,257, filed on Jun. 9, 2009.

(51) Int. Cl.
 *H03M 13/00* (2006.01)
(52) U.S. Cl.
 USPC .......................................... 714/758
(58) Field of Classification Search
 USPC .......................... 714/758, 781, 807
 See application file for complete search history.

(56) References Cited

U.S. PATENT DOCUMENTS

| | | | | | |
|---|---|---|---|---|---|
| 5,014,276 | A | * | 5/1991 | Bush et al. | 714/704 |
| 5,381,423 | A | * | 1/1995 | Turco | 714/762 |
| 5,592,404 | A | * | 1/1997 | Zook | 708/492 |
| 6,049,903 | A | * | 4/2000 | Nishimura | 714/752 |
| 6,052,815 | A | * | 4/2000 | Zook | 714/758 |
| 6,192,498 | B1 | * | 2/2001 | Arato | 714/781 |
| 6,427,219 | B1 | * | 7/2002 | Yang | 714/758 |
| 6,751,771 | B2 | * | 6/2004 | Chuang et al. | 714/784 |
| 6,836,869 | B1 | * | 12/2004 | Wyland | 714/781 |
| 7,584,389 | B2 | * | 9/2009 | Park et al. | 714/704 |
| 8,161,359 | B1 | * | 4/2012 | Chen | 714/781 |

FOREIGN PATENT DOCUMENTS

WO 2004/021630 A1 3/2004

OTHER PUBLICATIONS

International PCT Search Report and Written Opinion, PCT/US2010/037913, 10 pages, Mailed Aug. 18, 2010.

* cited by examiner

*Primary Examiner* — James C Kerveros
(74) *Attorney, Agent, or Firm* — King & Spalding L.L.P.

(57) ABSTRACT

A cyclic redundancy check (CRC) unit has a programmable CRC engine, a variable buffer memory operable to store k words wherein each word has n-bits, wherein k and n can be varied, and shift logic operable to shift data from the variable buffer memory into the programmable CRC engine.

21 Claims, 5 Drawing Sheets

REGISTER 1-2: CRCCON2 – CRC CONTROL 2 REGISTER

| U-0 | U-0 | U-0 | R/W-0 | R/W-0 | R/W-0 | R/W-0 | R/W-0 |
|---|---|---|---|---|---|---|---|
| — | — | — | DWIDTH4 | DWIDTH3 | DWIDTH2 | DWIDTH1 | DWIDTH0 |
| 15 | 14 | 13 | 12 | 11 | 10 | 9 | 8 |

| U-0 | U-0 | U-0 | R/W-0 | R/W-0 | R/W-0 | R/W-0 | R/W-0 |
|---|---|---|---|---|---|---|---|
| — | — | — | PLEN4 | PLEN3 | PLEN2 | PLEN1 | PLEN0 |
| 7 | 6 | 5 | 4 | 3 | 2 | 1 | 0 | bit 15-13  Unimplemented: Read as '0'
bit 12-8   DWIDTH[4:0]: Data Word Width Configuration bits
           Configures the width of the data word (data word width - 1)
bit 7-5    Unimplemented: Read as '0'
bit 4-0    PLEN[4:0]: Polynomial Length Configuration bits
           Configures the length of the polynomial (polynomial length - 1)

PROGRAMMABLE CYCLIC REDUNDANCY CHECK CRC UNIT

CROSS-REFERENCE TO RELATED APPLICATIONS

This application claims the benefit of U.S. Provisional Application No. 61/185,257 filed on Jun. 9, 2009, entitled "32 BIT PROGRAMMABLE CRC ENGINE", which is incorporated by reference herein in its entirety.

TECHNICAL FIELD

The present disclosure relates to integrated circuit devices having cyclic redundancy check (CRC) calculation capabilities, and, more particularly, to integrated circuit devices providing flexible programmability.

BACKGROUND

CRC devices can be used, for example, in microcontrollers to verify the content of data transmissions or data storing. CRC protocols are well known in the art. In a CRC operation data is shifted into a CRC engine to perform the respective check to verify that the data has been stored/transmitted correctly. To this end, in particular, certain CRC protocols use a fixed shift direction. However, certain transmission methods may use different way of storing and transmitting data. For example, the general protocol rooted in universal asynchronous receiver/transmitter (UART) technology, typically transmits the least significant bit (LSb) first whereas the protocol rooted in serial peripheral interface (SPI) technology transmits the most significant bit (MSb) first. Hence, processing of such data is often required before it can be fed into a CRC engine.

SUMMARY

There exists a need for a more flexible CRC engine. According to an embodiment, a cyclic redundancy check (CRC) unit may comprise a programmable CRC engine, a variable buffer memory operable to store k words wherein each word comprises n-bits, wherein k and n can be varied, and shift logic operable to shift data from said FIFO memory into said programmable CRC engine.

According to a further embodiment, the variable buffer memory can be a first-in first-out (FIFO) memory. According to a further embodiment, depending on a control signal the shift logic may perform a left shift or a right shift operation. According to a further embodiment, the shift logic may comprise a controllable shift buffer and a control register coupled with the shift register for setting a shift direction. According to a further embodiment, the control register may comprise a single bit indicating the shift direction. According to a further embodiment, the shift logic may further comprise a multiplexer having a first and second input coupled with a left and a right output of said shift buffer, respectively and being controlled by said control register. According to a further embodiment, each n-bit word in the variable FIFO memory may comprise m bytes, wherein m can vary from 1 to Q, Q being an integer greater 1 and according to yet another embodiment may be set to Q=4. According to a further embodiment, the FIFO memory may comprise a counter whose content indicates the number of available n-bytes. According to a further embodiment, the counter may generate an interrupt signal when it reaches a predetermined value. According to a further embodiment, the shift buffer can be coupled with said FIFO memory in parallel. According to a further embodiment, k can be equal to four and n can be equal to 32.

According to another embodiment, a method for performing a cyclic redundancy check (CRC) may comprise the steps: storing data in a variable buffer memory configured as an k-word deep and n-bit wide storage element, wherein k and m can be varied; and shifting the data from said buffer memory into a programmable CRC engine.

According to a further embodiment of the method, the step of shifting can be performed such that depending on a control signal the shifting is performed as a left shift or a right shift operation. According to a further embodiment of the method, the variable buffer memory can be configured as a first-in first-out (FIFO) memory. According to a further embodiment of the method, the method may further comprise the step of loading data from said buffer memory into a controllable shift buffer and controlling the shift buffer to left or right shift said loaded data into said CRC engine. According to a further embodiment of the method, the method may further comprise the step of programming a control register bit to indicate the shift direction to said shift buffer. According to a further embodiment of the method, the method may further comprise the step of multiplexing a left and a right output of said shift buffer. According to a further embodiment of the method, each n-bit word in the variable FIFO memory may comprise m bytes, wherein m can vary from 1 to Q, Q being an integer greater 1 and according to a further embodiment may be set Q=4. According to a further embodiment of the method, the method may further comprise the step of counting the number of data elements stored in said FIFO memory by a counter. According to a further embodiment of the method, the method may further comprise the step of generating an interrupt signal when the counter reaches a predetermined value. According to a further embodiment of the method, k can be equal to four and n can be equal to 32.

According to yet another embodiment, a cyclic redundancy check (CRC) unit may comprise a programmable CRC engine, a variable first-in first-out (FIFO) memory configured as an k-word deep and n-bit wide storage element, wherein k and n can be varied, and a controllable shift buffer coupled in parallel with said FIFO memory, a control register coupled with the shift register for setting a shift direction, and a multiplexer having an output coupled with said CRC engine and a first and second input coupled with a left and a right output of said shift buffer, respectively and being controlled by said control register.

BRIEF DESCRIPTION OF THE DRAWINGS

A more complete understanding of the present disclosure and advantages thereof may be acquired by referring to the following description taken in conjunction with the accompanying drawings wherein.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

DETAILED DESCRIPTION

CRC is one of the most versatile error checking algorithm used in various digital communication systems. CRC stands for Cyclic Redundancy Code Check or simply Cyclic Redundancy Check. Most of the popular communication protocols, like CAN, USB, IrDA®, SDLC, HDLC and Ethernet, employ CRC for error detection. Normally, for the error detection in digital communication systems, a checksum is computed on the message that needs to be transmitted. The computed checksum is then appended at the end of the message stream and is transmitted. At the receiving end, the message stream's checksum is computed and compared with the transmitted checksum. If both are equal, then the message received is treated as error free.

CRC works in a similar way, but it has greater capabilities for error detection than the conventional forms. Different CRC polynomials are employed for error detection. The size of CRC depends upon the polynomial chosen. A dedicated hardware module can be used to implement a CRC. All CRC calculations are carried out in the GF (2) (Galois field for 2 elements); 'field' is something in which perform addition, subtraction, multiplication and division can be performed and the '2 elements' specifies the field which has only two values, either '1' or '0'. This is analogous to the binary field or Modulo 2. Modulo 2 arithmetic uses binary addition or subtraction with no carry, which is equivalent to the XOR operation. Multiplication and division are similar to binary multiplication and division, respectively. The message to be transmitted is treated as a polynomial and divided by an irreducible (prime) polynomial known as the 'generator polynomial'. The degree of the generator polynomial should be less than that of the message polynomial. For a 'n+1' bit generator polynomial, the remainder will not be greater than 'n' bits. The CRC checksum of the data is the binary equivalent of the remainder after the division.

If a message of 'M' of 'x' bits and generator polynomial 'G' of 'n+1' bits is considered, dividing the message by the generator will yield a remainder 'R' of 'n' bits. Therefore, M=GQ+R; where Q is the quotient obtained when M is divided by G.

$$M = G \cdot Q + R$$

$$M + R = GQ = M - R \qquad (1)$$

(Since addition and subtraction are equivalent in Modulo 2 arithmetic.) Now, M+R=GQ, where the checksum is embedded into the message (M+R). Here, by adding the checksum to the message, the last 'n' bits of the message are corrupted. Instead of embedding the checksum in the message, the checksum is appended to the message, thus avoiding the corruption of message bits. When the remainder is appended to the message for transmission, it is equivalent to shifting the message bits by the number of remainder bits. Initially, the message stream is appended with zeros. After the checksum calculation, zeros are replaced with the actual checksum computed, which is the binary equivalent of the remainder of the division. The number of appended zeros is dependent on the degree of generator polynomial.

Appending 'n' zero bits to the message polynomial is equivalent to multiplying the polynomial by $2^n$. Equation 2 explains this:

$$M = G \cdot Q - R$$

$$M2^n = Q \cdot G + R^1$$

$$M2^n + R^1 = Q^1 \cdot G \qquad (2)$$

From Equation 2, it can be noticed that G is the exact multiple of ($M2^n + R^1$). At the receiving end, if G is an exact multiple of the message, then the message is not corrupted.

In the binary field, data is in the form of a polynomial (i.e., if the data field is '11101', then it can be represented in the polynomial form by writing as $X^4 + X^3 + X^2 + X^0$).

Generally, a generator polynomial is irreducible and the Most Significant bits and the Least Significant bits are always '1'. Some generator polynomials and their interpretation are shown below in Table 1.

TABLE 1

| Type | Polynomial | Binary | Hex |
|---|---|---|---|
| CRC . 12: | X12 + X11 + X3 + X2 + X + 1 | 1100000001111 | :180Fh |
| CRC . 16: | X16 + X15 + X2 + 1 | 11000000000000101 | :11021h |
| CRC . CCITT: | X16 + X12 + X5 + 1 | 10001000000100001 | :18005h |

Figure 6:
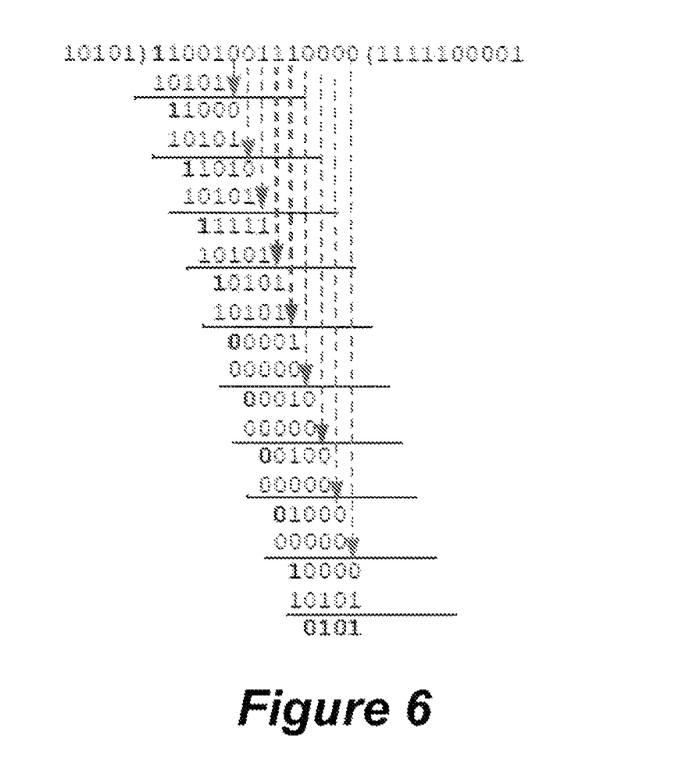
FIG. 6 shows an exemplary CRC calculation.

As shown in an exemplary calculation in FIG. 6, the following assumes a message polynomial is '110010011' and a generator polynomial is '10101' (n+1=5). For the CRC computation purpose, four (n) zeros are appended to the message polynomial and divide the message polynomial by the generator polynomial.

From FIG. 6, it can be inferred that in every step the upper most bit of the result is shifted out. These shifted out bits form the quotient of the polynomial division. The remainder of the polynomial division is the CRC of the message. With the given division example, it can be deduced that:

If the upper most bit of a message polynomial is '1', then a XOR with the generator polynomial is performed. Then, this message polynomial is shifted by 1 bit.

If the upper most bit is a 0.0., perform a shift operation by 1 bit on the message polynomial (because XOR with zeros results in the same polynomial).

With the above inferences, an algorithm for CRC computation can be defined as:

1. If the Most Significant bit is 0.1., shift the message bits by 1 position and perform a XOR operation.
2. If the Most Significant bit is 0.0., shift the message bits by 1 position.
3. If there are still more bits, then repeat from step 1.

It can be noted that the shift operation is performed first and then the XOR operation. When the generator polynomial is 'n+1' bits, the Most Significant bit is always '1'. Since it is always '1', it can be made redundant or need not be indicated. So, effectively, .'n' bits can be used to represent the generator polynomial instead of 'n+1' bits. If '10101' is assumed as the generator polynomial, since the MSb is the redundant bit, the actual bit length is 4 bits instead of 5 bits. Actual XOR operation should be performed when the shift register MSb is '1'; since the 5th bit is not considered, the 4th bit is observed, and when it is logic '1', it is shifted by 1 more bit and perform the XOR operation. Therefore, a shift operation is performed first before the XOR operation.

Figure 7:
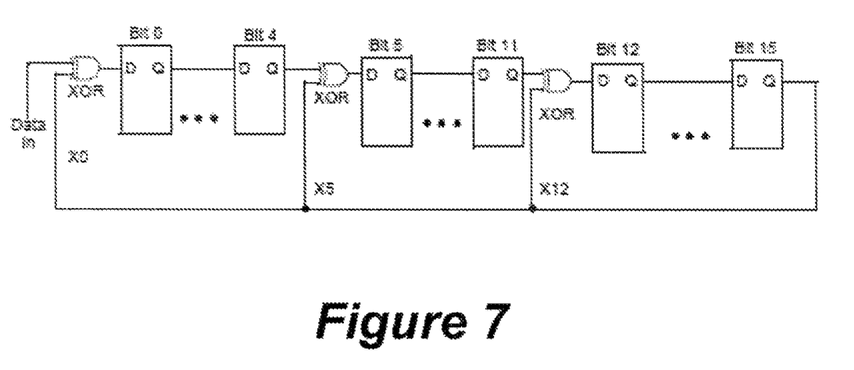
FIG. 7 shows elements of a generic CRC engine.

The above algorithm can be used for the CRC computation both in hardware and software. In hardware, CRC calculation is done using a Linear Feedback Shift Register (LFSR). The LFSR constitutes D-flip-flops and XOR gates as shown for example in FIG. 7, the number of shift registers is equal to the degree of the selected generator polynomial. The XOR gates form a feedback from the LFSR register to act as a tap controller for the polynomial. After the entire message bits have shifted out, the bits which have been shifted out form the quotient and the remaining bits in the shift register form the remainder.

CRC is a simple and robust operation which is accomplished using a shift register in Modulo 2 arithmetic. This is because Modulo 2 calculation is simply realized by XORing numbers; hence, it is very popular. In this type of CRC operation, both the remainder and the quotient can be obtained. Since, the quotient in CRC computation is not needed, it is neglected, and only the remainder is taken from the LFSR register. At the receiving end, the message stream plus the checksum are treated as the message for CRC computation. If the result is zero, then the received message, along with the CRC, is error free, else the message stream is corrupted.

According to various embodiments, a programmable CRC unit can be integrated into a microcontroller and provides for a flexible use. The programmable CRC unit can be combined with a direct memory access (DMA) controller or a variety of serial transmission interfaces. According to various enhancements, a shift logic is provided between a buffer memory, such as for example a variable FIFO memory, and the CRC engine. The shift logic provides the CRC engine with data from the buffer memory through different shift operations. Depending on a control signal, either a left shift or a right shift operation is performed. Thus, the CRC engine either receives the data with the MSb or the LSb first. Furthermore, the buffer memory can be arranged to be organized in different ways to accommodate the stored data. In a particular embodiment, a buffer memory, for example, a variable FIFO, can be switched from being organized in a n-byte fashion wherein n can represent any integer number greater 1. For example, the buffer memory may accommodate four 32-bit double words, eight 16-bit words, or 16 bytes.

Figure 1:
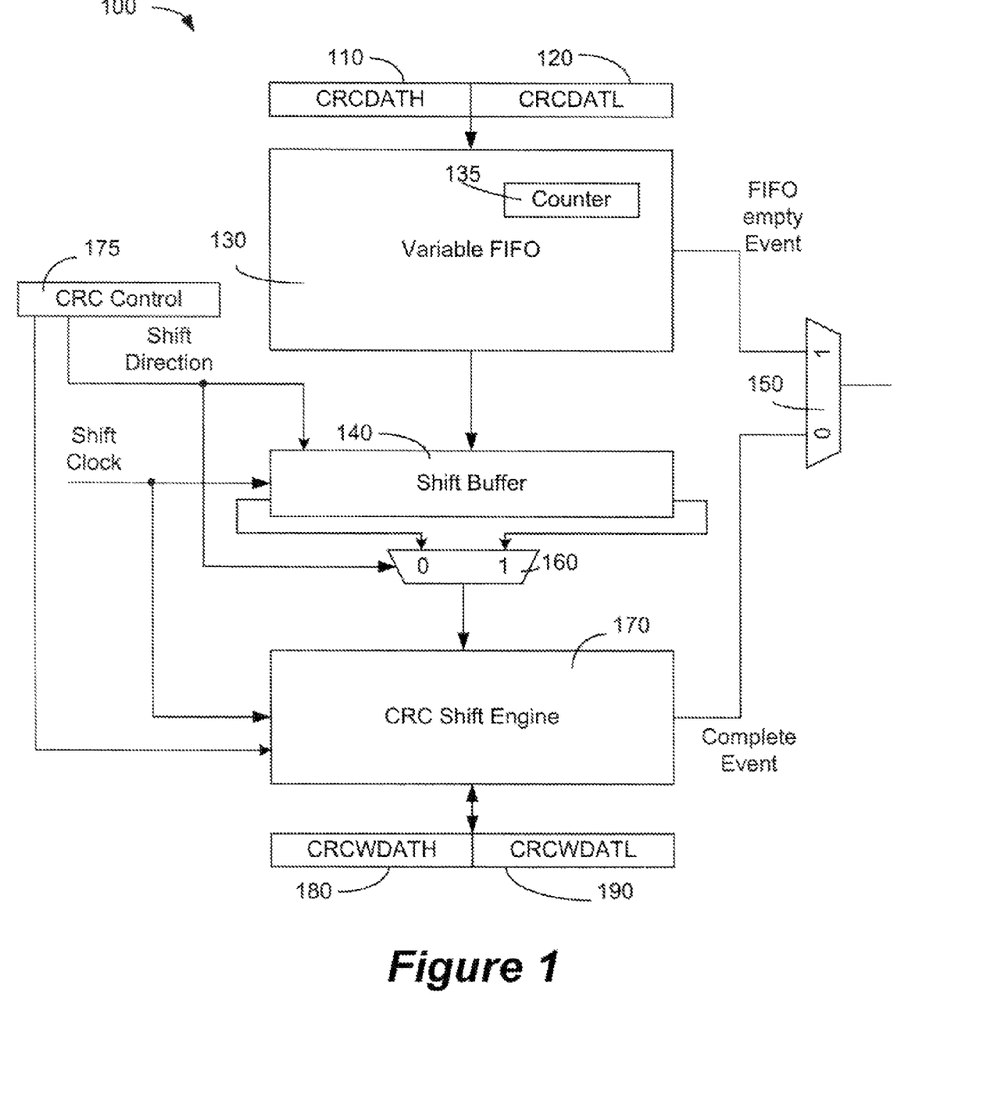
FIG. 1 is a block diagram of a programmable CRC unit according to an embodiment.

FIG. 1 shows an embodiment of a programmable CRC unit 100. Register 110 and 120 are each 16-bit registers and contain the high word and low word as received by a data transmission. This register is coupled with a variable buffer memory 130. Buffer memory 130 may be realized as a variable FIFO memory. However, other embodiments of buffer memory 130 are possible. Buffer memory 130 may for example comprise four 32-bit data entries. The term variable is to be understood that the buffer memory 130 can handle differently sized data words. It may be used for four 32-bit words, eight 16-bit words or sixteen 8-bit words.

According to one embodiment, buffer memory is a variable FIFO 130 which is coupled with a shift logic to feed the data in serial fashion into CRC engine 170. For example, the shift logic can comprise shift buffer or register 140 having first and second shift outputs, a multiplexer 160, and a control register 175. Shift buffer 140 can be controlled to either shift to the left or right, for example by means of a respective signal provided by CRC control register 175. Control register 175 may control other functions of CRC engine 170. The shift buffer 140 comprises a left and right output which are coupled with first and second inputs of multiplexer 160 to provide for a left shift and right shift function. The output of multiplexer 160 is coupled with the serial data input of CRC engine 170 which is also coupled with control registers 180, 190. Other shift logic may be used to perform a similar function. Control registers 180 and 190 each are 16-bit registers storing the data width in a high and a low word, respectively. CRC shift engine 170 may generate a complete event signal fed to multiplexer 150. Multiplexer 150 also receives a FIFO empty event signal from FIFO 130 to indicate that new data needs to be stored into the FIFO 130. A Shift Clock signal is furthermore provided that controls the shifting in shift buffer 140 and the CRC engine 170.

According to an embodiment, a cyclic redundancy check (CRC) module 100 can be for example integrated within a DMA controller 100 used in a microcontroller or in a microcontroller as a separate peripheral unit. For example, the CRC unit 100 can be coupled between a DMA engine and a data transmission bus for performing a cyclic redundancy check or may be coupled with any type of serial transmission device. The CRC module is programmable by means of control registers. Thus, a CPU can control the CRC unit 100 and program it according to a CRC specification as will be explained in more detail below. Data can be routed indirectly into the CRC engine 170 via a variable buffer memory such as the variable FIFO memory 130.

The CRC engine 170 may have a programmable CRC tap of, for example, N to 16 bits as will be explained in more detail below, a user can implement any particular CRC algorithm required for communication protocols. To this end, the CRC generator may utilize a TAP register for programming the CRC algorithm, a read/write CRC register which may contain the initial preload of the CRC value and the final result after a CRC operation.

Figure 2:
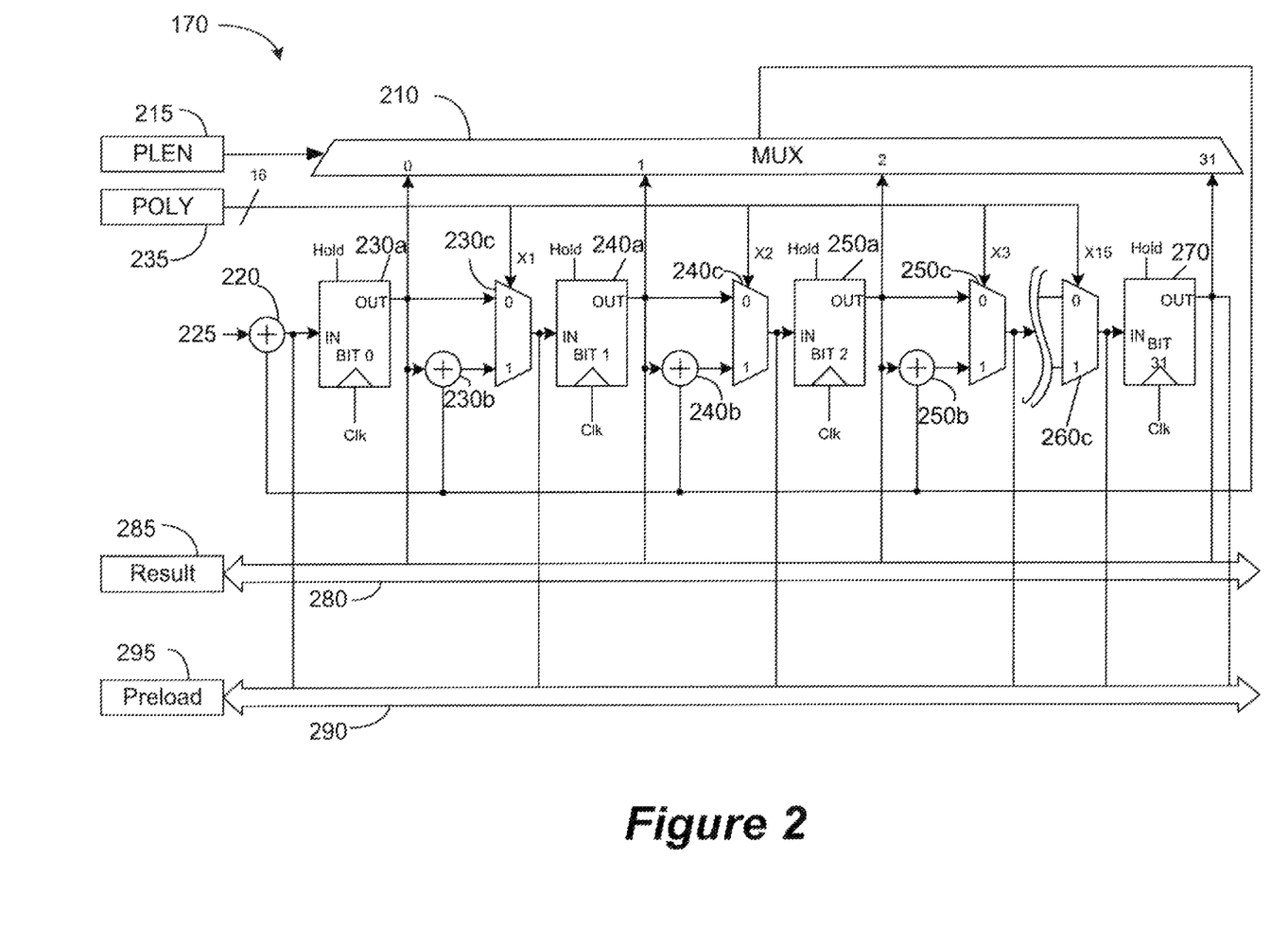
FIG. 2 is a block diagram of an exemplary CRC engine as used in FIG. 1.

FIG. 2 shows an embodiment of CRC engine 170 that can be used, for example, within a microcontroller. A TAP register is formed by shift register cells 230a, 240a, 250a, . . . 270 which are controlled by clock signal Clk and hold signal Hold. The embodiment shown in FIG. 2 depicts certain sections of a 32 bit CRC generator. However, other configurations with 8 or 16 bits or any other size can be easily realized. The input of cell 230a is coupled with the output of XOR gate 220 which receives the serial data input signal 225 and the feedback output signal from multiplexer 210. The output of cell 230a is coupled with the first input of multiplexer 210, the first input of select multiplexer X1, the first input of XOR gate 230b, and the CRC Read bus 280. The second input of XOR gate 230b is coupled with the feedback output signal from multiplexer 210 and the output of XOR gate 230b with the second input of select multiplexer 230c. The output of select multiplexer 230c is coupled with the input of the next shift cell 240a and with the CRC Write bus 290. The next shift cells 240a . . . 250a are provided with respective XOR gates 240b . . . 250b and select multiplexers 240c . . . 260c and connected in the same way as cell 230a to respective inputs of multiplexer 210 and busses 280 and 290. The output of the last cell 270 is coupled with the last input of multiplexer 210, and CRC Read and Write busses 280 and 290. Multiplexer 210 is controlled by polynomial length register 215 PLEN. Multiplexers 230c . . . 260c are controlled by the polynomial register 235 POLY. CRC Read bus 280 can be coupled with register 285 containing the result and CRC Write bus 290 can be coupled to register 295 containing the preload value.

The multiplexer 210 is used to select the feedback point and effective length of the CRC generator through register PLEN. Register 215 controls the length of the CRC generator 200 and is user selectable. The feedback data which is provided by the output of multiplexer 210 is XORed with the data currently in the CRC shift register 230a, 240a, 250a, 270 by means of the XOR gates 230b . . . 260c. Select multiplexers 230c, 240c, 250c and 260c are used to select whether the XOR data or the previous data in the shift register 230a, 240a, 250a, 270 is shifted on the next clock. Polynomial Register 235 is used to configure which bits are shifted through and which bits take the feedback data XOR'ed with the previous data in the CRC generator which contains the X1 input of multiplexers 230c, 240c, 250c and 260c. CRC Write bus 290 can be used to pre-load the CRC flip-flops 230a, 240a, 250a, 270 by means of preload register 295. CRC Read bus 280 can be used to read the value of the CRC generator. Data 225 is provided by the output of multiplexer 160 and shifted into the CRC through XOR gate 220. The arrangement shown in FIG. 2, thus, provides for a linear feedback shift register (LFSR) with various configurations based on tap/XOR location in a LFSR-style chain. According to one embodiment as shown in FIG. 1, an interrupt signal can be generated through multiplexer 150 when the CRC operation is complete to indicate to the central processing unit that a CRC has been completed. In addition, a variety of other interrupt signals can be generated, for example, FIFO 130 may generate such a signal when all content has been transferred into shift buffer 140 or when only a single entry is left.

A 32-bit architecture and the independent polynomial length/data width provide more strength and flexibility to the CRC calculation while the programmable shift direction avoids having to reformat the software data. The CRC engine can be a standard serial shifting CRC engine as for example shown in FIG. 2 with feed-forward and feedback points configurable through multiplexer settings. However, any other type of CRC engine may be used. The Generator Polynomial can be programmed using the 32-bits. Writing a '1' into a flip-flop 230a, 240a, 250a, 270 enables the XOR gate 220, 230b, 240b, 250b associated with that element of the polynomial. The polynomial length register 215 signals the length of the polynomial, and switches a multiplexer 210 to dictate the tap from which the feedback comes. The data width register 180, 190 configures the width of the data word and affects the number of clocks after which the FIFO 130 advances to the next data word. The result of the CRC calculation can be obtained by reading the holding flip-flops 230a, 240a, 250a, 270 through the CRC Read Bus 280 and stored in register 285.

Data Width

Figure 5:
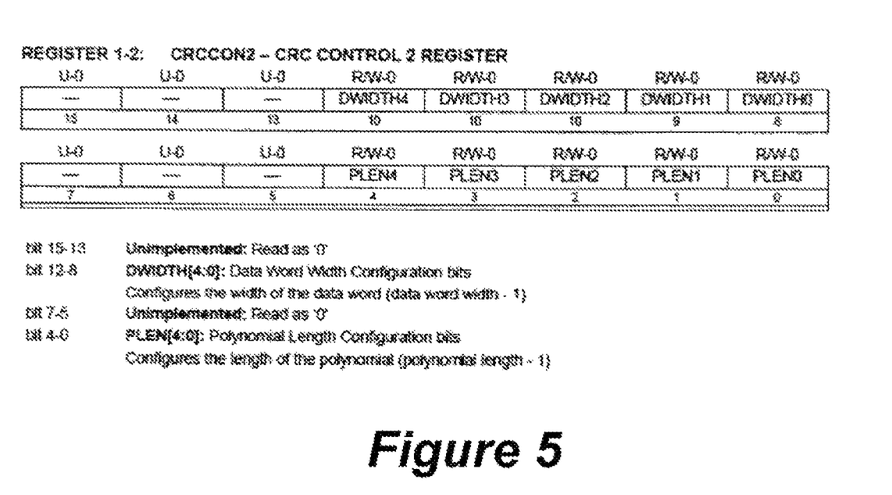
FIG. 5 shows a control register according to an embodiment.

The data width can be configured independent of the polynomial length using the data width configuration bits as shown, for example, in FIG. 5. There are no restrictions on the relationship between the data width and the polynomial length. If the data is wider than the polynomial length, extra clocks will shift the wider data through the polynomial and vice versa.

Data FIFO

As mentioned above, the FIFO 130 may be physically implemented as a 4 deep, 32-bit wide storage element with byte-write capability. The logic associated with the FIFO 130 may contain a 5-bit counter 135 which reflects how many new words remain in the FIFO 130. The valid length for a CRC word may be determined by the end user setting the data width. Although the length of the CRC word can be anywhere between 1 and 32, the logic may only flag valid writes at byte granularity, in other words, 8, 16, 32 bits, etc. Therefore, it follows that if the data width is 7 or below, the FIFO logically appears to be 16 bytes deep, and the maximum value of the counter 135 is 16. If data width is between 8 and 15, the FIFO appears to be 8 words deep, and the maximum value of the valid word counter 135 is 8. If data width is 16 or greater, the FIFO appears to be 4 words deep, and the maximum value of the counter 135 is 4. Counter 135 is coupled with logic to generate the interrupt signal "FIFO empty event". This signal can be generated when the counter 135 reaches zero or alternatively when it reaches 1 or another predetermined low count value to indicate to the CPU that the FIFO needs to be refilled.

Data Shift Direction

To accommodate various CRC protocols, the data shift direction can be configured using the shift direction bit (LENDIAN) in CRC control register 175. When this bit LENDIAN=0, the data words are presented to the CRC engine 170 starting with the most significant bit first (big endian) through multiplexer 160. This is also referred to as reflecting the input data. When LENDIAN=1, the data words are presented to the CRC engine 170 starting with the least significant bit first (little endian) through multiplexer 160. To this end, shift buffer 140 comprises a left and a right output which are coupled with first and second inputs of multiplexer 160. Multiplexer 160 can be controlled by the shift direction bit LENDIAN of control register 175.

Figure 3:
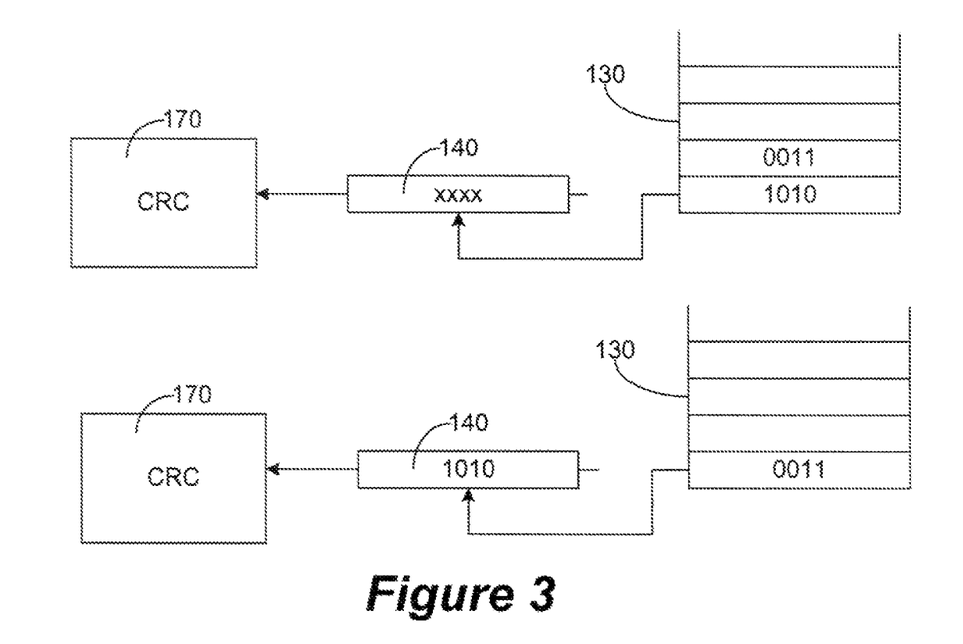
FIGS. 3 and 4 show various steps using the embodiment shown in FIG. 1.
Figure 4:
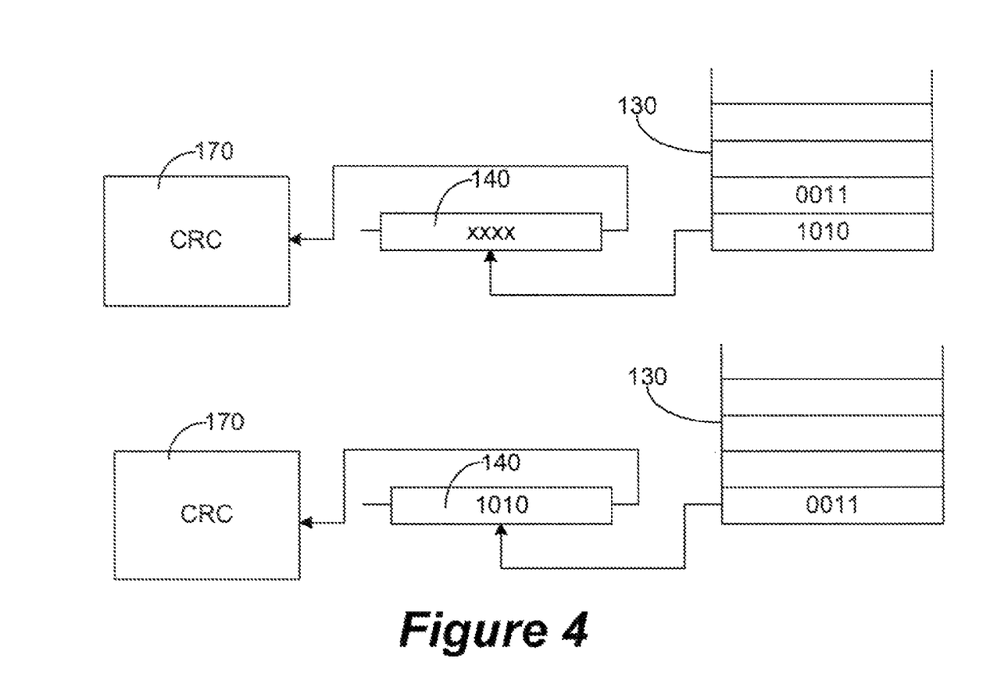

FIG. 3 shows an example in which CRC engine 170 is fed by the first or left output of shift register 140. First, the next available data are transferred in parallel from FIFO 130 into shift register 140. This data is then shifted left through the left output of shift register 140 into CRC engine 170 as required by the CRC calculation. FIG. 4 shows the same procedure using the right output of shift register 140. Thus, according to various embodiments, a user does not need to modify the respective data before they are stored in FIFO 130. Depending on the structure of the received data, the user merely needs to program the shift direction of shift buffer 140.

FIG. 5 shows an example of another CRC control register which is configured to be 16-bit wide. In this control register data width and polynomial length are each stored as 5 bits. As can be see, six bits are unused and according to another embodiment, one of these unused bits could be used to represent the LENDIAN bit as explained above. However, separate registers for the data width and the polynomial length as well as the shift direction bit LENDIAN could be used.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A cyclic redundancy check (CRC) unit, comprising:
    a programmable CRC engine comprising a linear feedback shift register (LFSR);
    a variable buffer memory operable to store k words wherein each word comprises n-bits, wherein k and n can be varied; and
    a controllable shift buffer and a control register coupled with the controllable shift buffer for setting a shift direction operable to serially shift data from said variable buffer memory into the LFSR said programmable CRC engine using a left or right shift operation depending on a value stored in said control register.

2. The CRC unit according to claim 1, wherein the variable buffer memory is a first-in first-out (FIFO) memory.

3. The CRC unit according to claim 2, wherein each n-bit word in the variable buffer memory comprises m bytes, wherein m can vary from 1 to Q, Q being an integer greater 1.

4. The CRC unit according to claim 3, wherein Q=4.

5. The CRC unit according to claim 1, wherein the control register further controls parameters of said programmable CRC engine.

6. The CRC unit according to claim 1, wherein the control register comprises a single bit indicating the shift direction.

7. The CRC unit according to claim 6, wherein the variable buffer memory comprises a counter whose content indicates the number of available n-bit words.

8. The CRC unit according to claim 7, wherein the counter generates an interrupt signal when it reaches a predetermined value.

9. The CRC unit according to claim 1, further comprising a multiplexer having a first and second input coupled with a left and a right output of said shift buffer, respectively and being controlled by said control register.

10. The CRC unit according to claim 1, wherein the shift buffer is coupled with said variable buffer memory in parallel.

11. The CRC unit according to claim 1, wherein k is equal to four and n is equal to 32.

12. A method for performing a cyclic redundancy check (CRC), comprising:
    storing data in a variable buffer memory configured as a k-word deep and n-bit wide storage element, wherein k and m can be varied; and
    moving an n-bit word in parallel into a shift buffer;
    depending on a control signal serially left or right shifting the data from said shift buffer into a linear feedback shift register (LFSR) of a programmable CRC engine.

13. The method according to claim 12, wherein the variable buffer memory is configured as a first-in first-out (FIFO) memory.

14. The method according to claim 13, wherein each n-bit word in the variable FIFO memory comprises m bytes, wherein m can vary from 1 to Q, Q being an integer greater 1.

15. The method according to claim 14, wherein Q=4.

16. The method according to claim 14, further comprising the step of counting the number of data elements stored in said FIFO memory by a counter.

17. The method according to claim 16, further comprising the step of generating an interrupt signal when the counter reaches a predetermined value.

18. The method according to claim 12, further comprising the step of programming a control register bit to indicate the shift direction to said shift buffer.

19. The method according to claim 12, further comprising the step of multiplexing a left and a right output of said shift buffer.

20. The method according to claim 12, wherein k is equal to four and n is equal to 32.

21. A cyclic redundancy check (CRC) unit, comprising:
    a programmable CRC engine;
    a variable first-in first-out (FIFO) memory configured as an k-word deep and n-bit wide storage element, wherein k and n can be varied; and
    a controllable shift buffer coupled in parallel with said FIFO memory, a control register coupled with the shift register for setting a shift direction to either serially left or right shift data from said shift register, and a multiplexer having an output coupled with said CRC engine and a first and second input coupled with a left and a right output of said shift buffer, respectively and being controlled by said control register.

* * * * *